United States Patent [19]

Tanaka et al.

[11] 4,030,037

[45] June 14, 1977

[54] PROXIMITY DETECTING APPARATUS

[75] Inventors: Minoru Tanaka; Shoichi Mitani, both of Yokohama; Takeo Yuminaka, Katsuta; Rokuro Sasaki, Katsuta; Hatuya Nakamura, Katsuta, all of Japan

[73] Assignee: Hitachi, Ltd., Japan

[22] Filed: Jan. 21, 1974

[21] Appl. No.: 435,268

[30] Foreign Application Priority Data

Jan. 22, 1974 Japan .................... 49-9649

[52] U.S. Cl. .................... 328/5; 307/308; 340/258 C; 331/65
[51] Int. Cl.² .................... G01V 3/10
[58] Field of Search .......... 328/5; 340/258 C; 330/30 D, 69; 331/65, 57; 317/246; 307/229, 308

[56] References Cited

UNITED STATES PATENTS

| | | |
|---|---|---|
| 2,747,152 | 5/1956 | Greene .................... 328/5 |
| 3,199,033 | 8/1965 | Atkins et al. .................... 328/5 |
| 3,314,066 | 4/1967 | Schwartz et al. .............. 340/258 C |
| 3,515,984 | 6/1970 | King et al. .............. 340/258 C UX |
| 3,517,326 | 6/1970 | Roesch .................... 331/57 |
| 3,553,575 | 1/1971 | Shea .................... 330/30 D |
| 3,600,606 | 8/1971 | Clor .................... 330/69 |
| 3,634,843 | 1/1972 | Corris .................... 340/258 C |
| 3,732,443 | 5/1973 | Lovrenich .................... 331/65 |
| 3,753,140 | 8/1973 | Feistel .................... 330/69 |
| 3,896,371 | 7/1975 | Hametta .................... 331/65 |

Primary Examiner—Stanley D. Miller, Jr.
Assistant Examiner—B. P. Davis
Attorney, Agent, or Firm—Craig & Antonelli

[57] ABSTRACT

A compact and low-cost apparatus for detecting the proximity of a human body and generating a corresponding electrical signal is disclosed which apparatus includes an oscillator and an operational amplifier. Under normal conditions, equal input voltages are applied to the input terminals of the operational amplifier, whereas the equilibrium of the input voltages is lost by the approach of a human body to the apparatus.

10 Claims, 7 Drawing Figures

PROXIMITY DETECTING APPARATUS

The present invention relates to a proximity switch for detecting an approaching human body or other conductive object and generating a corresponding electrical signal.

The conventional proximity switches are such that the oscillating conditions of an oscillator included in the proximity switch are changed by utilizing the electrostatic capacity produced between a human body or other conductive material and a detector means of the proximity switch as a result of the approach of the human body or conductive material. For example, the oscillator is energized or de-energized or its oscillation frequency is changed, by the use of an electrostatic capacity produced between the detector means of the proximity switch and a human body or the earth. An oscillation circuit or system meeting such a demand inevitably includes such component elements as an inductance and capacitance. In view of the fact that the inductance and capacitance cannot be easily realized in a compact form, especially in integrated circuits, it is almost impossible to reduce the size of the proximity switch by the conventional methods.

It is an object of the present invention to provide a proximity switch capable of being manufactured in a compact form.

Another object of the present invention is to provide a low-cost proximity switch which can be easily manufactured.

The proximity switch according to the present invention comprises means for always producing an AC signal and a differential amplifier or operational amplifier having a first and a second input terminal.

One of the features of the present invention is that in the above-described construction equal AC signals are applied to the first and second input terminals of the differential amplifier or operational amplifier through resistors under normal conditions thereby to prevent the differential amplifier or operational amplifier from producing its output signal, whereas this equilibrium between the voltages applied to the first and second input terminals of the differential amplifier or operational amplifier is lost in the event that a human body approaches detector means connected to the first input terminal of the differential amplifier or operational amplifier, whereby the amplifier produces an output signal due to an electrostatic capacity established between the human body and the detector means.

Another feature of the present invention is that in the above-described circuit arrangement the voltage of the first input terminal having the detector means is maintained slightly higher than that of the second input terminal thereby to cause the differential amplifier or operational amplifier to produce an output signal of one polarity. When a human body or the like approaches the detector means, the voltage applied to the first input terminal drops and as a result the potential of the second input terminal becomes higher than that of the first input terminal, thereby reversing the polarity of the output of the differential amplifier or operational amplifier.

In the proximity switch with the above-described arrangement, the means for supplying an AC signal is not necessarily an oscillator itself but may alternatively be an external AC signal source. In the case where the oscillator is used as such AC supply means, it may be of any type including neither inductance nor capacitance, thus permitting the use of an oscillator in the form of integrated circuits. In this connection, the employing an oscillator including three or a greater odd number of inverter circuits connected in a ring form, for example, will greatly contribute to further reduction in the size of the proximity switch.

The above and other objects, features and advantages will be made apparent by the detailed description taken in conjunction with the accompanying drawings, in which.

Figure 1:
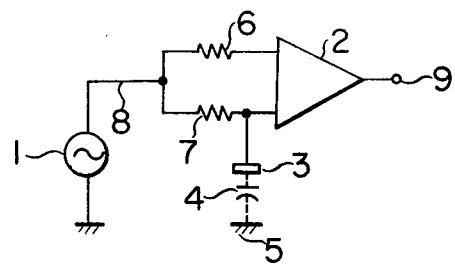
FIG. 1 is a circuit diagram for explaining the fundamental principle of the present invention.
Figure 4:
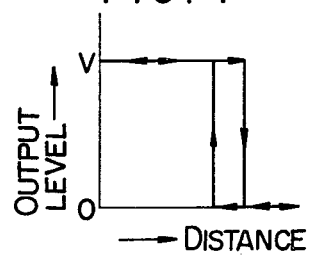
Figure 5:
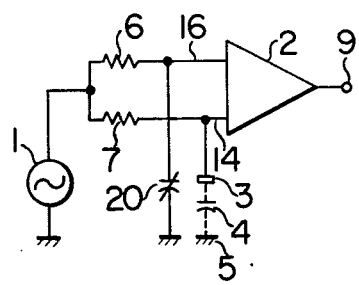
Figure 6:
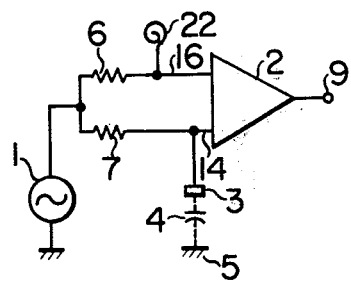
Figure 7:
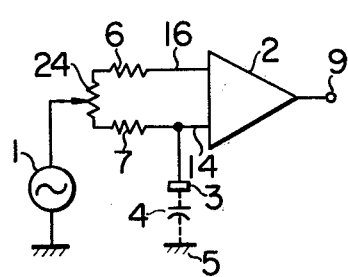

FIG. 4 a graph showing the output of the differential amplifier or operational amplifier as related to the distance between the detector plate of the proximity switch and a human body;

FIG. 5 is a circuit diagram including means for regulating voltages applied to each of the input terminals of the differential amplifier or operational amplifier used in the proximity switch of FIG. 1;

FIG. 6 shows another example of the voltage regulating means shown in FIG. 5; and FIG. 7 shows still another example of the voltage regulating means illustrated in FIG. 5.

Referring to FIG. 1 showing the fundamental principle of the proximity switch according to the present invention, reference numeral 1 shows an oscillator, numeral 2 an operational amplifier, numeral 3 a plate for detecting an approaching object, numeral 4 an electrostatic capacitance established between the detecting plate 3 and the earth 5 by the approach of the object to the detecting plate 3, numerals 6 and 7 resistors, numeral 8 an output of the oscillator 1 and numeral 9 an output terminal of the proximity switch. The magnitude of electrostatic capacitance 4 formed between the detecting plate 3 and the earth 5 with the approach of the object depends on the type and shape of the object to be detected and the distance between the detecting plate 3 and the object. When a finger of a man touches a detector plate of metal of 1 cm in diameter, for example, the electrostatic capacitance of the order of several pF to several tens pF is produced. The always-oscillating oscillator is connected to the operational amplifier and when an object approaches the junction point between them, the equilibrium of the operational amplifier is lost and a desired output is produced at the output terminal 9.

Under normal conditions, substantially identical signals are applied from the oscillator to the two input terminals of the operational amplifier 2 and therefore the potentials at the two input terminals are in equilibrium, so that no signal is produced from the output terminal 9. Under the condition where an object such as a human body approaches the detector plate 3, an electrostatic capacitance is created between the detecting plate 3 and the earth 5. Such a situation is equivalently illustrated by inserting the capacitor 4 between the detecting plate 3 and the earth 5 as shown in the drawings. The equilibrium so far maintained at the input terminals of the operational amplifier is lost thereby to produce an output at the terminal 9.

The oscillator 1 is provided for the purpose of applying an AC signal through the resistors 6 and 7 to the operational amplifier 2 and may be replaced by an AC power supply. Also, in view of the very small capacitance of the capacitor 4, the frequency of the oscillator 1 should be as high as possible.

Figure 2:
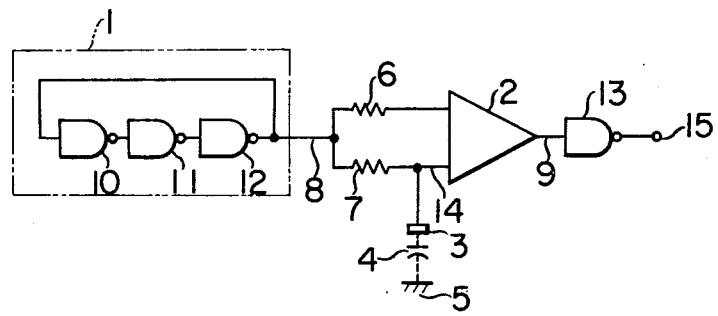
FIG. 2 is a circuit diagram showing inverters used for the oscillator included in the circuit of FIG. 1.

FIG. 2 shows an illustrative circuit embodying the fundamental circuit arrangement of FIG. 1. In this circuit arrangement, to achieve the compactness and high integration of the apparatus, the oscillation circuit includes logical NAND gates 10, 11 and 12 which are connected in the form of a ring. The oscillation occurs due to the fact that the output of each of the NAND gates lags behind the input thereof.

Figure 3:
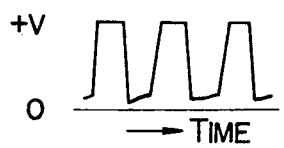
FIG. 3 shows an oscillation waveform produced as an output from the circuit of FIG. 2.

Each NAND gate is used an inverter and, by connecting three or a greater number of inverters in ring form, an always-oscillating oscillator is obtained. The inverters employed in the embodiment under consideration comprise NAND gates of bipolar integrated circuits with one input or their inputs short-circuited, the oscillation frequency of the three gates being about 25 MHz. A waveform produced at the output terminal 8 of the oscillator 1 is as shown in FIG. 3. The resistors 6 and 7 have substantially the same resistance value. The operational amplifier 2 employed in the present embodiment is formed into integrated circuits. The output of the oscillator 1 is connected to the input terminals of the operational amplifier 2 through the resistors 6 and 7. When the metal plate 3 is not approached by any conductive material, the inputs to the operational amplifier 2 are in equilibrium and therefore the output terminal 9 is at zero potential. When a conductive material such as a human body approaches or touches the metal plate 3 connected to the input terminal 14 of the operational amplifier 2, the electrostatic capacitor 4 is created between the metal plate 3 and the earth 5. The equilibrium of the inputs to the operational amplifier 2 is lost and the difference therebetween is amplified and produced at the output terminal 9. The difference of the inputs takes a pulsating wave having a waveform similar to that shown in FIG. 3. If the amplification factor of the operational amplifier 2 is selected to 80 dB or more and its frequency 1 MHz or less, for example, a slight difference saturates the amplifier thereby to produce a DC output at the output terminal 9. The greater the amplification factor of the amplifier 2, the sharper the variations in voltage level of the output terminal 9. In order to render it even sharper, an inverter circuit or NAND gate circuit 13 is connected to the output of the operational amplifier 2, and by utilizing the quick response of this circuit, a variation in voltage level at the output terminal 15 in the final stage between ON and OFF time is completed in several tens of nano-seconds. In spite of the short time required for the voltage level variation, the amplitude of the variaton in voltage level appearing at output terminal 15 is fixed as illustrated in FIG. 4. This diagram illustrates a hysteresis which develops in the operation of the proximity switch as the object to be detected approaches and moves away from the detecting plate. The difference in the operation point of the proximity switch due to the hysteresis is between 10 and 100 microns at an optimum value of the electrostatic capacitor 4 as related to the resistance value of the resistors 6 and 7.

Since the output ofthe oscillator 1 is connected to the input of the operational amplifier 2 through the resistors 6 and 7 of substantially the same resistance value, the operation of the operational amplifier 2 is very stable against the variations in source voltage or variations in the oscillation output of the oscillator 1 due to variations in quality of the component elements and changes in their characteristics due to lapse of time. For example, the proximity switch functions satisfactorily even under the variations of ± 50% of the source voltage with respect to its rated value.

The NAND circuits 10, 11, 12 and 13 in the circuit arrangement of FIG. 2 function as ordinary inverter circuits and may satisfactorily consist of inverter switching circuits. They operate quite the same way as an inverter circuit if the inputs of the NAND gates are short-circuited into a single input.

The above-explained operation is concerned with the case in which the equilibrium maintained under normal conditions between the inputs of the operational amplifier 2 is disturbed by the proximity of a human body or other conductive object. In spite of this, the invention may be embodied with equal effect in such a manner that the input terminal 14 of the operational amplifier 2 is maintained at a slightly higher potential than the other input terminal thereof under normal conditions. If the input terminal 14 is taken as a negative terminal of an ordinary operational amplifier, a positive output is produced at the output terminal 9, and if it is taken as a positive terminal, a negative output is produced. Assuming that the circuit is in the former state, a positive output is produced at the output terminal 9 and reversed by the NAND circuit 13, that is, an inverter circuit, thereby to produce a negative signal at the terminal 15.

When a human body or the like approaches, the capacitance 4 is created and the potential at the input terminal 14 drops to a level determined by the resistor 7 and capacitance 4. As a result, the potential of the terminal 14 becomes lower than that of the other input terminal and the polarity of the output terminal 9 is reversed thereby to reverse the output characteristic of the output terminal 15, thus detecting the proximity of a human body or the like.

Regulation of the input voltages to the operational amplifier under normal conditions will be explained with reference to FIGS. 5, 6 and 7. In the drawings, component elements of like numerals have like functions as those of like numerals in FIGS. 1 and 2. The input terminals of the operational amplifier 2 are connected through the resistors 6 and 7 to the output of the oscillator 1. When the metal plate 3 is not touched or approached by a human body or the like, the inputs to the operational amplifier 2 are in equilibrium and therefore the potential of the output terminal 9 is at zero. Even under this condition, if a lead wire to the detecting plate 3 is long enough, however, an electrostatic capacitance created between the lead wire and the earth causes the inputs of the operational amplifier 2 to be initially placed out of equilibrium. An actual exemplary method to recover such an equilibrium is to connect the metal detecting plate 3 to the input terminal 14 of the operational amplifier 2 while connecting the other input terminal 16 with a variable capacitance 20 for achieving a desired equilibrium, as shown in FIG. 5.

In the second method shown in FIG. 6, the purpose of achieving the equilibrium between the inputs to the operational amplifier 2 is attained by merely adding a lead wire 22, the length of which is varied as required.

The third method for achieving the equilibrium is shown in FIG. 7, in which the equilibrium is attained by inserting a variable resistor 24 between the resistors 6 and 7 connected to the input terminals of the operational amplifier 2.

It was already mentioned that a desired result is obtained also by maintaining the potential at the input terminal 14 of the operational amplifier 2 at a higher level than at the input terminal 16 by adjusting the regulating means. In this case, the proximity of a human body or the like to the detecting means causes the capacitance 4 to be created and the electric potential at the terminal 14 is exceeded by that at the terminal 16, thereby reversing the polarity of the output from the output terminal 9.

What is claimed is:

1. A proximity detecting apparatus comprising:
   an oscillator having an output terminal for generating high frequency voltage signals;
   an operational amplifier having at least two input terminals;
   at least one impedance element inserted between said output terminal of said oscillator and said input terminals for maintaining one of said input terminals at a slightly higher potential than the other input terminal; and
   a conductive metal plate connected to said one of said input terminals for forming in response to proximity of an object thereto an electrostatic capacitance between said metal plate and earth through said object.

2. An apparatus according to claim 1, wherein said at least two input terminals of said operational amplifier are commonly supplied with an output of said oscillator.

3. An apparatus according to claim 2, in which said impedance element includes a variable resistor.

4. An apparatus according to claim 1, in which said impedance element includes a lead wire of variable length connected to at least one of said terminals.

5. An apparatus according to claim 4, wherein said at least two input terminals of said operational amplifier are commonly supplied with an output of said oscillator.

6. An apparatus according to claim 2, in which said oscillator includes at least three inverters connected in a ring form.

7. An apparatus according to claim 1, in which said operational amplifier has an output terminal for providing an output of one polarity when no object is detected and an output of opposite polarity upon detection of the proximity of an object.

8. An apparatus according to claim 7, wherein said conductive metal plate in response to the detection of the proximity of an object forms an electrostatic capacitance for lowering the potential at said one of said input terminals lower than the potential at the other input terminal.

9. An apparatus according to claim 8, wherein said at least two input terminals of said operational amplifier are commonly supplied with an output of said oscillator.

10. An apparatus according to claim 1, wherein said at least two input terminals of said operational amplifier are coupled to said output terminal of said oscillator for receiving high frequency voltage signals therefrom.

* * * * *